US 8,450,126 B2

(12) United States Patent
Chen et al.

(10) Patent No.: US 8,450,126 B2
(45) Date of Patent: *May 28, 2013

(54) SEMICONDUCTOR TEST PAD STRUCTURES

(75) Inventors: Hsien-Wei Chen, Sinying (TW); Ying-Ju Chen, Tuku Township (TW); Yu-Wen Liu, Taipei (TW); Hao-Yi Tsai, Hsinchu (TW); Shin-Puu Jeng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/197,003

(22) Filed: Aug. 3, 2011

(65) Prior Publication Data

US 2011/0287627 A1    Nov. 24, 2011

Related U.S. Application Data

(63) Continuation of application No. 12/267,021, filed on Nov. 7, 2008, now Pat. No. 8,013,333.

(51) Int. Cl.
*H01L 21/66* (2006.01)
*G01R 31/26* (2006.01)

(52) U.S. Cl.
CPC ....................................... *H01L 22/34* (2013.01)
USPC ................................ 438/18; 257/48; 438/462

(58) Field of Classification Search
USPC ........................................ 438/462, 18; 257/48
See application file for complete search history.

(56) References Cited

U.S. PATENT DOCUMENTS

| | | | |
|---|---|---|---|
| 6,753,608 B2 | 6/2004 | Tomita | |
| 7,157,734 B2 | 1/2007 | Tsao et al. | |
| 7,196,428 B2 | 3/2007 | Chen | |
| 7,323,784 B2 | 1/2008 | Yiu et al. | |
| 7,372,153 B2 | 5/2008 | Kuo et al. | |
| 7,566,915 B2 * | 7/2009 | Chang et al. | 257/127 |
| 2006/0001144 A1 | 1/2006 | Uehling et al. | |
| 2006/0012012 A1 * | 1/2006 | Wang et al. | 257/620 |
| 2006/0022195 A1 | 2/2006 | Wang | |
| 2006/0125059 A1 | 6/2006 | Chen et al. | |
| 2008/0020559 A1 | 1/2008 | Chen et al. | |
| 2008/0191205 A1 | 8/2008 | Tsai et al. | |

* cited by examiner

*Primary Examiner* — Jerome Jackson, Jr.
(74) *Attorney, Agent, or Firm* — Duane Morris LLP

(57) ABSTRACT

A semiconductor test pad interconnect structure with integrated die-separation protective barriers. The interconnect structure includes a plurality of stacked metal layers each having an electrically conductive test pad separated from other test pads by a dielectric material layer. In one embodiment, at least one metallic via bar is embedded into the interconnect structure and electrically interconnects each of the test pads in the metal layers together. The via bar extends substantially along an entire first side defined by each test pad in some embodiments. In other embodiments, a pair of opposing via bars may be provided that are arranged on opposite sides of a die singulation saw cut line defined in a scribe band on a semiconductor wafer.

20 Claims, 7 Drawing Sheets

SEMICONDUCTOR TEST PAD STRUCTURES

CROSS-REFERENCE TO RELATED APPLICATIONS

This application is a continuation of U.S. application Ser. No. 12/267,021 filed Nov. 7, 2008, which is incorporated by reference herein in its entirety.

FIELD OF THE INVENTION

The present invention generally relates to semiconductors, and more particularly to test pad structures for semiconductor packages.

BACKGROUND

Modern semiconductor device packages are formed from multiple stacked layers of materials that may include numerous electrically active components that are electrically coupled together by metal conductor interconnects. Although aluminum conductors with silicon dioxide disposed between such interconnects have been used in the past, current practices in fabricating high speed semiconductor devices and have moved toward using a combination of copper interconnects with suitable dielectric insulating materials or films such as low-k dielectrics to take advantage of the superior conductivity of copper compared to aluminum and reduced parasitic capacitance between the conductors. This has reduced resistive capacitance delay ("RC delay") which limits increases in clock speed in integrated circuits and semiconductor devices.

Back end-of-line ("BEOL") processes are used to create the intricate network of conductor interconnects in each layer and between the multiple layers wherein copper is laid into the dielectric material. An additive patterning processes, referred to as damascene and dual damascene, are some BEOL process used to form the patterned copper conductor interconnect circuit(s) which interconnect various active components (e.g., resistors, transistors, etc.) disposed in the single and multiple layers throughout the microchip. Some of these interconnect circuit structures include trenches which are formed and then filled with the copper conductor and vias which are essentially metal-plated or filled holes that electrically interconnect the conductors interspersed between the multiple layers in the semiconductor packages.

Line-to-line capacitance between nearby interconnect lines has become an increasingly limiting factor on microprocessor clock speeds as semiconductor fabrication processes have been scaled down, for example to current 90 nm (nanometer) and 65 nm processes, and new 45 nm process. Low-k (LK) dielectric materials, such as Black Diamond® available from Applied Materials, Incorporated® which has a dielectric constant (k) lower than 3, have been used for forming ILD (inter-layer dielectric) or IMD (inter-metal dielectric) layers to better electrically isolate interconnects and reduce line-to-line capacitance for 90 nm and below processes, thereby concomitantly reducing resistive capacitance delay (RC delay) which hinders processor speeds. Further reduction of RC delay has been attempted by the introduction of more porous extreme low-k (ELK) and ultra low-k (ULK) dielectric materials (k generally equal to or less than about 2.5) such as Black Diamond II® which are targeted for the newer 45 nm process. Although the porosity introduced into these latter ELK and ULK dielectric materials further improves interconnect isolation by lowering the dielectric constant k, it also decreases the mechanical modulus making these materials more brittle that prior low-k materials and susceptible to damage such as cracking. The LK dielectric materials in general also have lower adhesive properties resulting in weaker bonding to other adjoining layers of semiconductor materials than traditional oxide dielectrics making the low-k materials more prone to delamination.

The semiconductor fabrication process entails forming a plurality of integrated circuit (IC) chips or dies on a single semiconductor wafer. These dies are later separated through a process known as die cutting or singulation in which typically a mechanical or laser saw is used to make cuts through the wafer between individual chips. To facilitate the die separation process, relatively narrow sacrificial scribe bands or streets are provided on the wafer along which the cuts are made to separate the chips.

To facilitate wafer level testing before the die separation process, the conductive paths of multi-layer interconnect structures formed within the dies are typically terminated in conductive bond or test pads disposed at the surface of the die. These "process control monitor" (PCM) test pads allow various electrical tests to be performed to monitor the complex semiconductor fabrication process and check the reliability of the dies before singulation. A multitude of test pads are typically distributed throughout the top surface of the wafer.

One conventional design approach for semiconductor wafers is to locate the test pads within and along sacrificial scribe bands or streets that typically traverse the wafer between the IC dies, as shown for example in FIGS. 1 and 2. During the die singulation process in which the individual dies are separated from the wafer, saw cuts are made along the scribe bands and pass directly through the test pads severing the pads. This process, however, produces mechanical stresses when the test pads are severed sometimes resulting in physical defects that may propagate into the dies adjacent the scribe bands and pads. For example, cracks and peeling may originate at the severed test pad when cut by the saw which then propagates to the dies. The cracking and peeling problems are often most acute at the corners of dies located at the intersection of scribe bands or streets. The saw-cut induced stresses can variously be manifested as cracking, chipping, flaking, peeling, and/or delamination of the layered semiconductor materials at the edges of the dies. The foregoing defects can further propagate more deeply into the die well beyond the die edges. Such defects adversely effects die reliability and increases die failure and rejection rates. Moreover, as noted above, low-K materials such as ELK and ULK dielectrics when used are especially susceptible to cracking, delamination, or the other foregoing defects due to non-adhesive and brittle nature of these insulting materials.

One conventional approach to mitigate the die cracking and peeling problem has been to incorporate separate protective structures or barriers into the wafer as shown in FIGS. 1 and 2, as further described generally in U.S. Patent Application Publication No. 2006/0125059 which in incorporated herein by reference in its entirety. These protective barriers may be made of metal and extend through multiple interconnect layers of the wafer. The barriers are generally linear in shape (top view) and may be continuous or interrupted in configuration as shown. As shown in FIGS. 1 and 2 herein, the barriers may extend along several PCM test pads and are located between the test pads and the dies within the scribe bands or streets to intercept cracks or peeling originating from the test pads when saw cut during the die singulation process. These protective barriers, however, occupy valuable space on the wafer within the scribe bands or streets which is contrary to the goal of providing minimum spacing between nearby dies to maximize the total number of dies that can be built on the wafer. For example, the N65 wafer fabrication process requirements dictate that the scribe bands or streets typically be about 60-80 microns wide providing margins between the edges of the PCM test pads and dies ranging from about 10-20 microns in width, depending on the width of the test pads. This spacing does not account for providing the additional surface space necessary to accommodate separate protective barrier structures within the scribe bands or streets, which consumes additional valuable surface space and require that the scribe bands be even wider.

An improved semiconductor structure is desired that reduces the potential for die defect formation resulting from the singulation process and that consumes less wafer surface space than conventional protective structures or barrier.

SUMMARY

A semiconductor test pad interconnect structure according to the present invention includes integrated metallic protective barriers to mitigate cracking and peeling propagation from die cutting into adjacent IC dies. The protective barriers may be conductive wall-shaped via bars that electrically interconnect the test pads formed in metallic layers of the test pad structure. The protective barriers intercept cracks and peeling before these defects can leave the test pad structure and enter adjacent wafer layers.

In one embodiment, a semiconductor test pad interconnect structure package includes: a plurality of vertically stacked metal layers, each metal layer including a test pad and an inter-metal dielectric material, the test pads each having a first side and a second opposite side; and at least a first metallic via bar embedded into the interconnect structure and being configured and arranged to electrically interconnect the test pads in the plurality of metal layers, the via bar engaging each of the test pads near the first side of each test pad and extending horizontally along substantially an entire length of each first side. The via bar preferably extends vertically through the dielectric material of each metal layer. In one embodiment, the via bar defines a wall-shaped protective barrier that has a vertical height that is at least coextensive with a vertical height of the plurality of metal layers.

In another embodiment, a semiconductor test pad interconnect structure package includes: a top metal layer including a top test pad having a planar surface and an inter-metal dielectric material disposed below the test pad, the test pad having a first pair of opposing sides each having a first length and a second pair of opposing sides each having a second length; a second metal layer disposed below the top metal layer, the second metal layer having a second test pad having a planar surface and an inter-metal dielectric material disposed below the second test pad, the second test pad having a first pair of opposing sides each having a first length and a second pair of opposing sides each having a second length; and a first pair of opposing metallic via bars extending from the top metal test pad to the second metal test to form an electrical interconnection therebetween, one of the via bars engaging the top and second test pads along substantially the entire first length of one of the first pair of sides of each of the top and second test pads. The opposing pair of via bars may be arranged in parallel relation to each other.

In one embodiment, a semiconductor wafer includes: a semiconductor substrate; a plurality of integrated circuit dies formed on the substrate and arranged across a top planar surface of the wafer; at least one longitudinally-extending scribe band formed between the dies and defining a longitudinally-extending saw cut line for separating the dies from the wafer; at least one test pad interconnect structure disposed in scribe band and having a portion that extends across the saw cut line, the interconnect structure comprising a plurality of vertically stacked metal layers, each metal layer including a test pad and an inter-metal dielectric material, the test pads each having a first side and a second opposite side; and at least a first longitudinally-extending metallic via bar embedded into a perimeter portion of the interconnect structure and engaging each of the test pads along substantially the entire first side of each of the test pads.

BRIEF DESCRIPTION OF THE DRAWINGS

The features of the preferred embodiments will be described with reference to the following drawings where like elements are labeled similarly, and in which.

Figure 1:
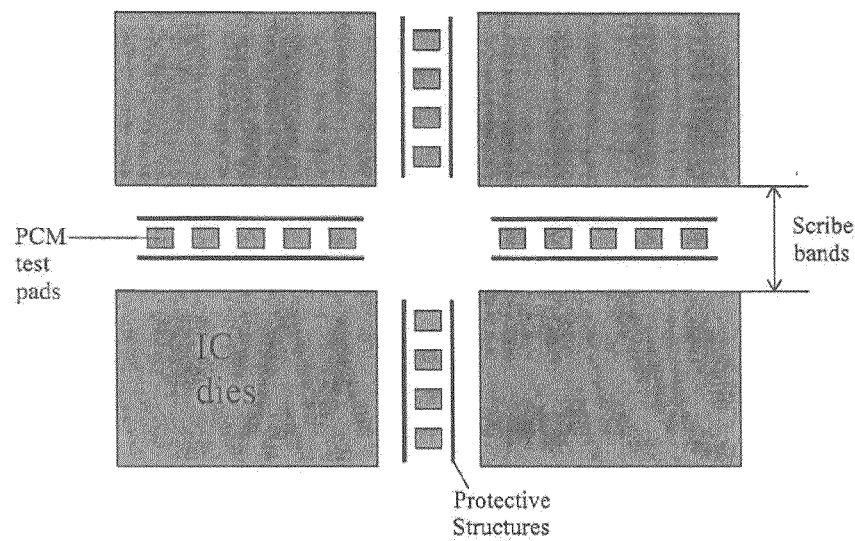
FIGS. 1 and 2 are plan views of a top level of a portion of a conventional semiconductor wafer including test pad interconnect structures and IC dies.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

Figure 2:
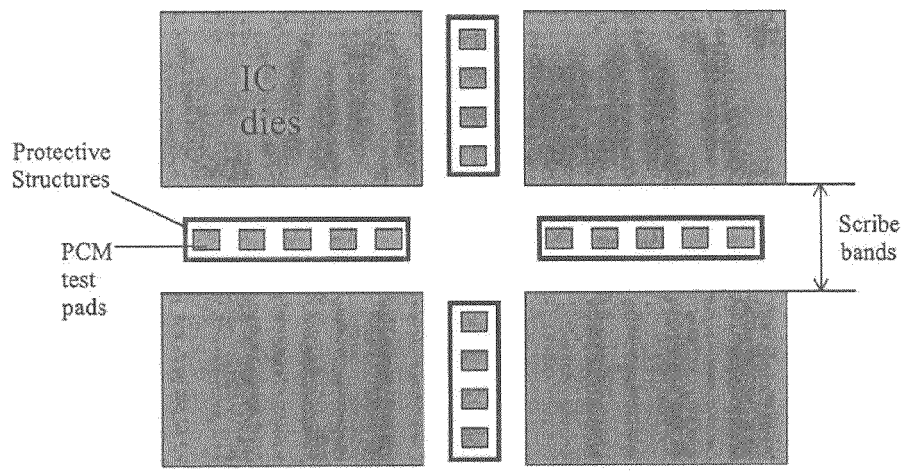
Figure 3:
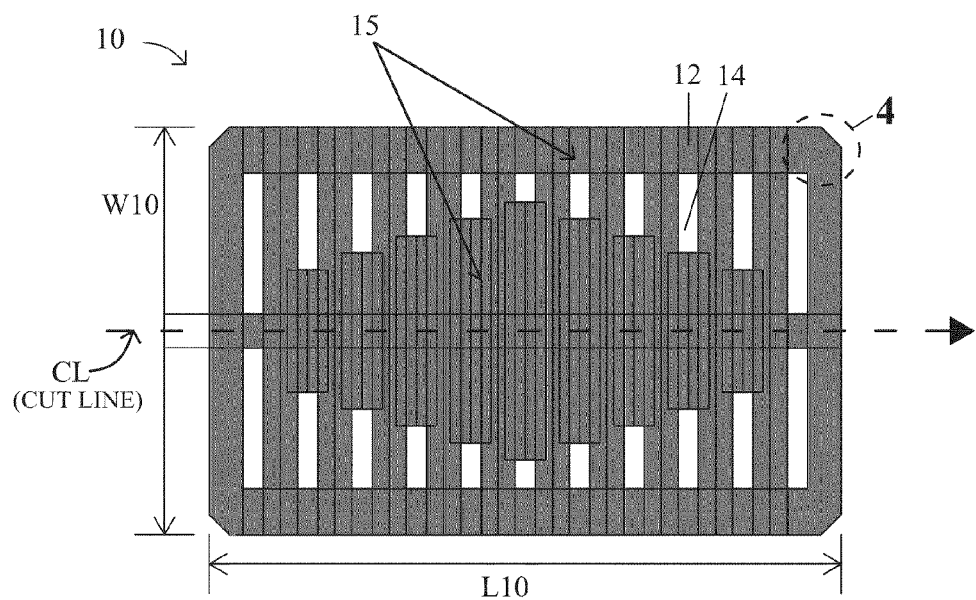
FIG. 3 is a plan view of a known test pad with cylindrical conductive vias.
Figure 4:
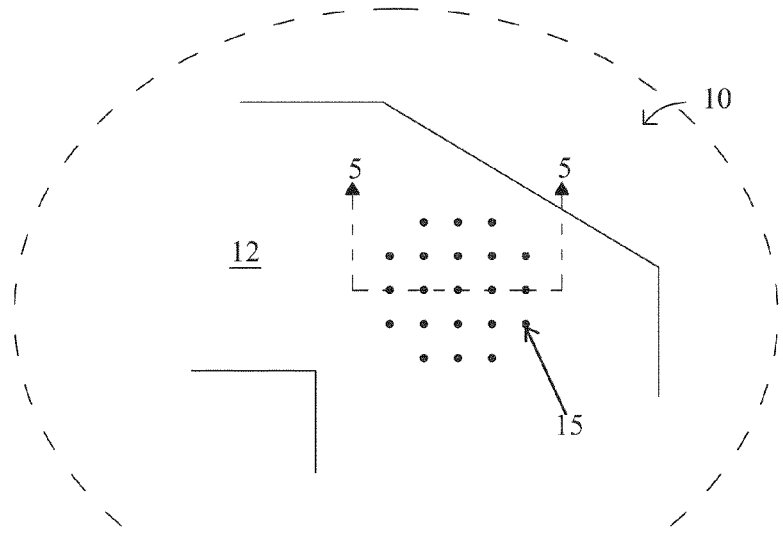
FIG. 4 is a detailed plan view of a portion of the known test pad of FIG. 3.
Figure 5:
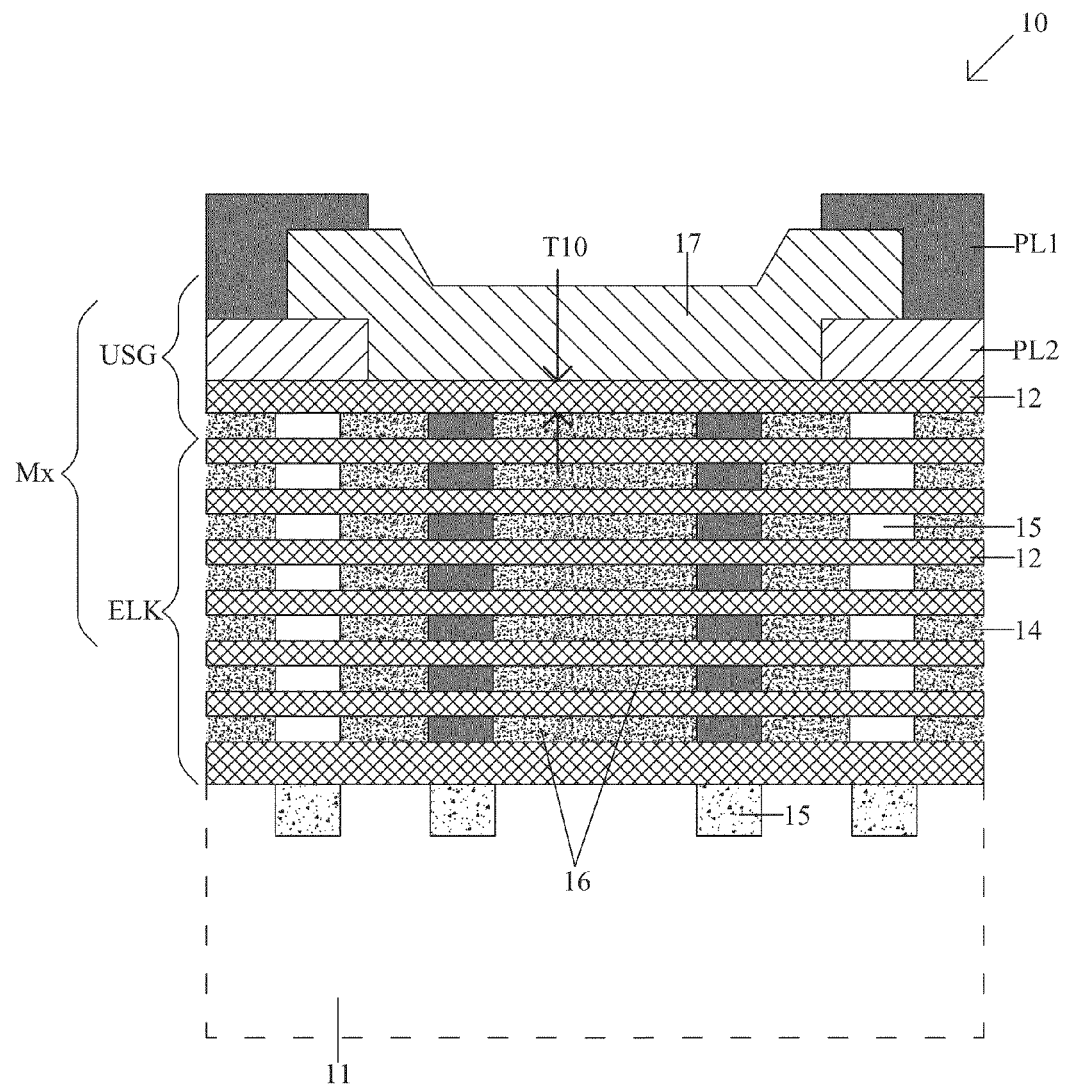
FIG. 5 is a cross-sectional view taken through the conventional test pad of FIG. 4 along line 5-5.

FIGS. 3-5 show a conventional PCM test pad interconnect structure 10. FIG. 3 is a plan or top view showing the top metal layer and uppermost test pad (with metal protective capping layer 17 and passivation layers PL1 and PL2 removed). Referring now to FIGS. 3-5, a conventional interconnect structure 10 includes a plurality of conductive metal layers Mx (where x=layer number 1, 2, 3, etc.) each comprised of PCM test pads 12 and an IMD (inter-metal dielectric) layer of an insulating material 14 interspersed therebetween that physically separates and electrically isolates test pads lying above/below other test pads. Metal layers Mx may be built on an underlying silicon-based semiconductor substrate 11, which in some embodiments may include electrically active devices. Test pads 12 have generally flat or planar upper and lower surfaces 13 having a horizontal width W10 and length L10 (see FIG. 3) substantially larger than the vertical thickness T10 (see FIG. 5) of the test pads (horizontal and vertical planes being based on the orientations defined in FIGS. 3-5). Test pads 12 may be disposed within the scribe bands or streets on the semiconductor wafer (see FIGS. 1 and 2). Insulating layers 14 may be formed of any suitable dielectric material such as LK, ELK, ULK, USG (undoped silicate glass), etc. The test pads 12 in each metal layer Mx may be identical in configuration or may have different configurations. In this embodiment, as best shown in top plan view in FIG. 3, test pad 12 may have an open structure with planar areas of metal interspersed with insulating dielectric material therebetween.

Test pads 12 in each metal layer Mx are electrically interconnected to other test pads above/below together by a plurality of conventional cylindrical vias 15 that extend normal or perpendicular to the planar surface 13 of each test pad 12. Vias 15 extend vertically through a plurality of metal layers Mx and may be arranged in various cluster formations as shown, with each via cluster containing a plurality of vias 15.

The conventional cylindrical vias 15 shown in FIGS. 3-5, however, do not provide a physical barrier to cracks or peeling radiating horizontally and laterally outwards from saw cut line CL into the insulating material 14 layers when test pads 12 are severed during the die singulation process by the dicing saw. As best shown in FIG. 5, which is a cross-sectional side view through a portion of interconnect structure 10, this is due to the fact that the vias 15 do not form a continuous metal barrier capable of intercepting and stopping crack or peeling propagating from saw cut line CL. There are numerous windows 16 of insulating material 14 extending horizontally and laterally through the metal layers Mx between vias 15 and test pads 12 (extending into and out of the plane of FIG. 3). Peeling and cracks, therefore, are free to propagate through the insulating material 14. As noted elsewhere herein, low-K dielectric materials 14 such as ELK and ULK are more porous and brittle than traditional oxide dielectrics making these low-K materials especially susceptible to such cracking or peeling propagation. Accordingly, the use of conventional protective structures or barriers as shown in FIGS. 1 and 2 already described herein have been employed to halt cracking and peeling originating from the saw cut line CL. This disadvantageously increases the width of the scribe bands or streets on the wafer and spacing between dies, thereby reducing the number of dies that can be fit onto a single wafer.

Figure 6:
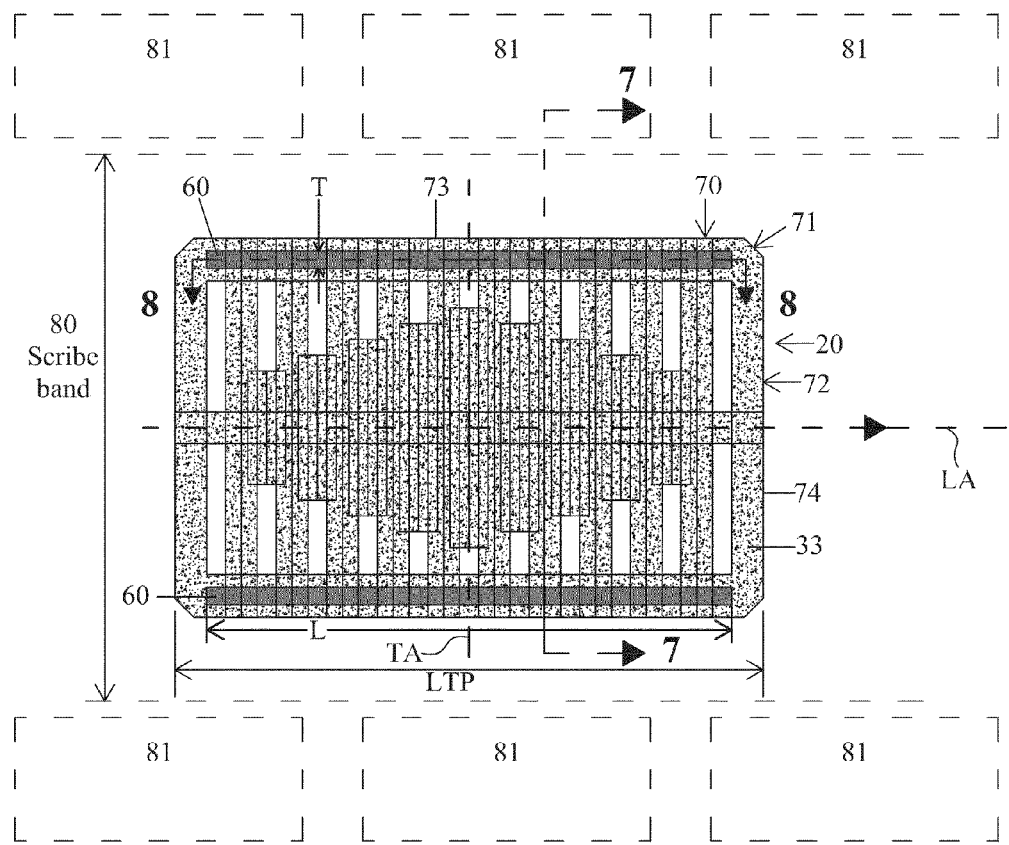
FIG. 6 is a plan view of one embodiment of a test pad interconnect structure according to the present invention.
Figure 7:
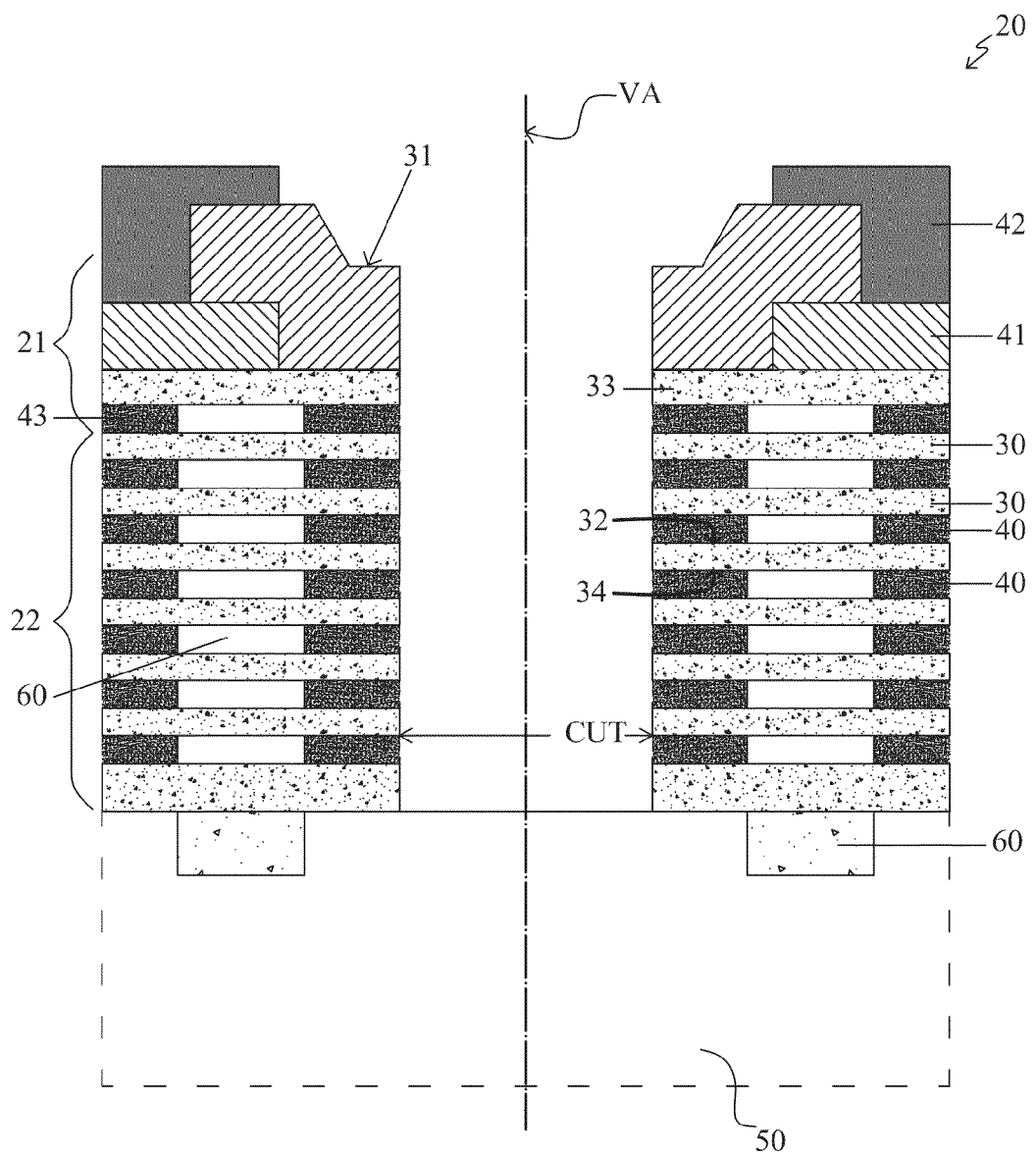
FIG. 7 is a cross-sectional view taken through the test pad of FIG. 6 along line 7-7.
Figure 8:
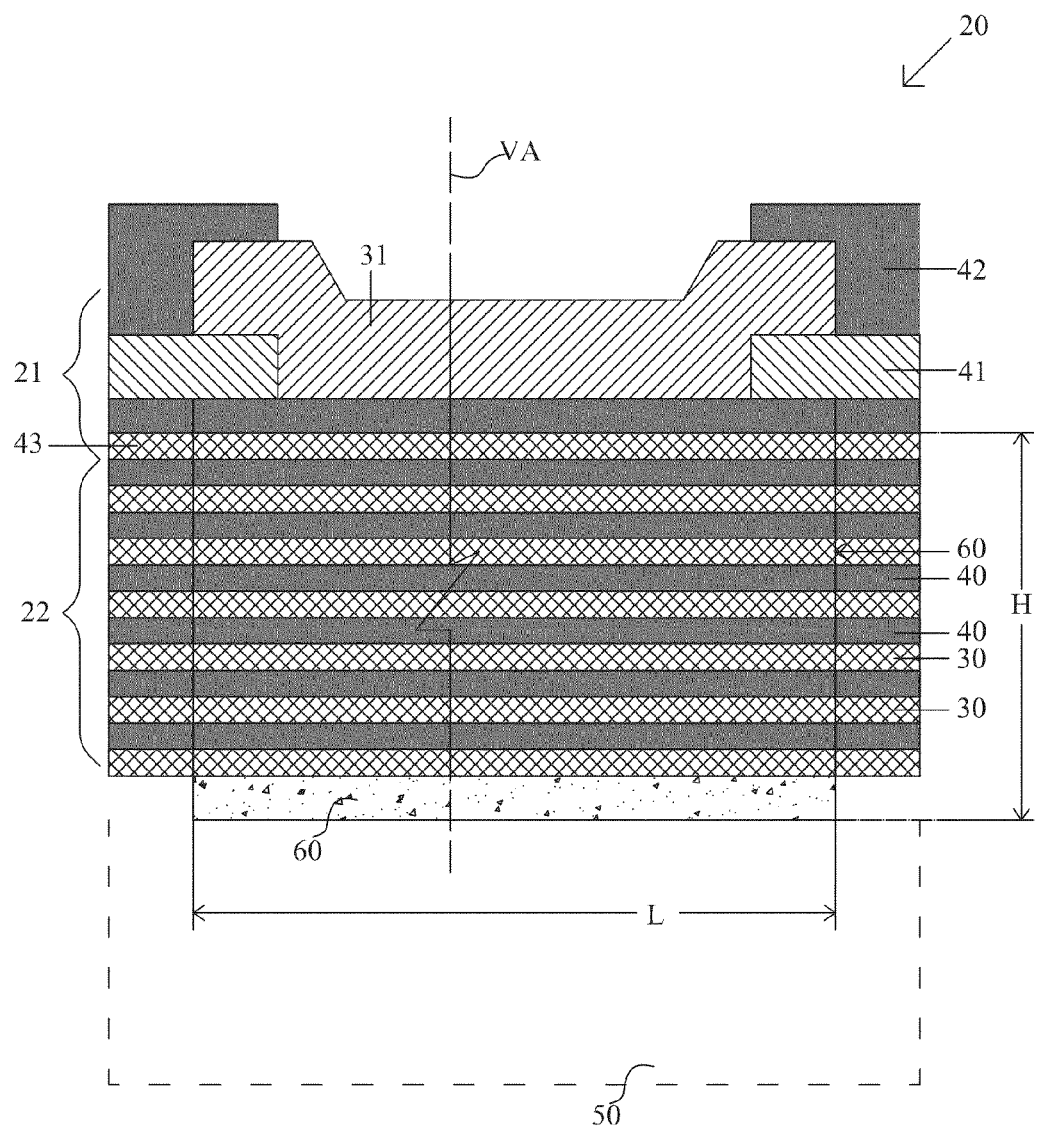
FIG. 8 is a cross-sectional view taken through the test pad of FIG. 6 along line 8-8.

FIGS. 6-8 show one embodiment of a multi-level test pad interconnect structure 20 according to the present invention that integrates an embedded protective structure or barrier into the PCM test pad itself to guard against cracking and peeling propagation, instead of relying on conventional separate external protective structures as shown in FIGS. 1 and 2. In one embodiment, the embedded protective structures may be specially-configured via barrier bars or walls as further described herein that are incorporated into the test pad proximate to its periphery. These via barrier walls are intended to intercept and stop cracks/peeling radiating outwards from the saw cut line before these defects leave the test pads and propagate into adjoining insulating layers and dies. Because the via walls according to the present invention provide the dual functionality of both electrically connecting the test pads in the multiple metal layers together and providing a protective barrier against cracking/peeling propagation, the need for conventional separate protective structures in the wafer may be eliminated. This allows narrower scribe bands to be used, minimizes the spacing between dies, and maximizes the number of dies that can be fit onto a single wafer.

FIG. 6 is a plan or top view showing the top metal layer and test pad of the interconnect structure 20 (with any metallic protective capping layer and passivation layers removed from the view for clarity). Test pad interconnect structure 20 is located within a scribe band 80 extending between a plurality of IC dies 81 in a conventional manner. FIG. 7 is a side cross sectional view taken through interconnect structure 20 perpendicular to die saw cut line CL shown in FIG. 6, after a cut has been through the interconnect structure with a dicing saw during the die singulation process. FIG. 8 is a side cross sectional view taken through interconnect structure 20 parallel to cut line CL as shown in FIG. 6.

Referring now to FIGS. 6-8, test pad interconnect structure 20 in one embodiment includes a plurality of vertically stacked metal layers 22 each including at least one PCM test pad 30 and insulating layers of an IMD (inter-metal dielectric) electrically insulating material 40 interspersed vertically between the test pads in a conventional manner. The stacked metal layers 22 may be formed on a semiconductor substrate 50 made of conventional semiconductor substrate materials, and in some embodiments may include electrically active devices. Test pads 30 have generally flat or planar upper surface 32 and lower surface 34. Preferably, test pads 30 may be disposed within the scribe bands or streets in the semiconductor wafer, as shown for example in U.S. Patent Application Publication No. US2006/0125059, which is incorporated herein by reference in its entirety. Test pads 30 may be of any suitable configuration, as shown by some exemplary embodiments in U.S. Patent Application Publication No. US2008/0020559, which is incorporated herein by reference in its entirety. In some embodiments, the test pads 30 in each metal layer 22 of interconnect structure 20 may be identical to each other or different in configuration.

A plurality of test pad interconnect structures 20 may be built into the wafer and located within the scribe bands in a conventional manner, as generally shown in FIGS. 1 and 2.

Referring to FIGS. 6-8, each test pad 30 defines a longitudinal axis LA oriented along the longitudinal extent of the scribe band, a transverse axis TA oriented perpendicular to axis LA and across the width of the scribe band, and a vertical axis VA oriented perpendicular to axis LA and TA. Axis LA and TA lie parallel to and in the surface plane defined by upper surface 32 of test pad 30. Axis VA lies perpendicular to the surface plane defined by upper surface 32 of test pad 30.

With continuing reference to FIGS. 6-8, each test pad 30 is supported by and electrically insulated from other nearby test pads in adjoining metal layers 22 above/below by insulating material 40. In some embodiments, the IMD layers of insulating material 40 may be formed of any suitable commercially-available electrically insulating dielectric materials conventionally used in the art, such as for example USG (undoped silicate glass), LK, ELK, ULK, etc. In a preferred embodiment, insulating material 40 is a LK, ELK, or ULK dielectric material. In some embodiments, conventional etch stop layers (not shown) which are well known to those skilled in the art may be interspersed between adjoining vertical insulating layers 40 as commonly used in semiconductor fabrication processes to control etching depth.

In some embodiments, referring to FIG. 7, the top metal layer 21 may be formed with a dielectric material 43 (shown immediately below top test pad 33 and interspersed between top test pad 33 and test pad 30 below) having greater mechanical strength (and generally associated higher dielectric constant k) than insulating materials 40 in the metal layers 22. In some exemplary embodiments, dielectric material 43 may be without limitation for example SiO2, SiN, SiON, PSG, BPSG. More preferably, dielectric material 43 may be a USG insulating dielectric material in one embodiment. Underlying metal layers 22 are preferably formed with an insulating dielectric material 40 having a lower dielectric constant k than the insulating material 43 used in top metal layer 21 (e.g. USG with a k value of about 4.1) for minimizing line-to-line capacitance between nearby interconnect lines in the wafer. In one embodiment, insulating material 40 used in metal layers 22 may be without limitation any suitable LK, ELK or ULK dielectric materials. Although USG has a higher dielectric constant than LK, ELK, or ULK materials, USG or other suitable higher dielectric constant insulating materials are stronger and less brittle making it better suited for the top metal layer because it is less susceptible to mechanical stresses caused by wafer saw cutting and/or touchdown contact by wafer test probe needles during PCM testing. Although a stronger material is preferably used for insulating material 43, it will be appreciated that in some possible embodiments insulating material 43 in top metal layer 21 may also be made of a LK, ELK, or ULK material.

Referring to FIG. 7, the top test pad 33 in top metal layer 21 in some embodiments may be at least partially covered by a protective metallic interconnect capping layer such as aluminum or aluminum alloy interconnect layer or cap 31. Cap 31 if formed on and above upper surface 32 of top test pad 33 and is in electrical contact the test pad. Aluminum and its alloys are more resistant to oxidation and corrosion than copper, thereby improving PCM testing reliability by enhancing good electrical contact between the test probe needles and cap (connected to test pad 33). In other embodiments, other suitable oxidation-resistant conductive metals known to those skilled in the art and conventionally used in semiconductor fabrication may be used to form cap 31 in lieu of aluminum. Cap 31 need only be sufficiently large enough in surface area to make good electrical contact with wafer test probe needles from above and top test pad 33 below. Top metal layer 21 may further be covered at least in part by one or more passivation layers 41 and 42 in combination with interconnect cap 31, to completely encapsulate top test pad 33 for oxidation and corrosion protection. The uppermost surface of the wafer may be covered by one or more passivation layers 41, 42 except for the wafer portions over cap 31 which are open for making electrical connection to the test probe needles. In some embodiments, the passivation layers 41, 42 may be made of any conventional passivation materials commonly used in semiconductor fabrication, such as without limitation SiN, SiON, SiO2, etc.

It will be appreciated that although a protective metallic interconnect layer such as cap 31 may be included in preferred embodiments, in other embodiments cap 31 may be omitted and top test pad 33 may be exposed for engaging PCM test probe needles.

Referring again to FIGS. 6-8, the test pad interconnect structure 20 includes embedded protective structures or barriers to intercept and stop cracking or peeling that may develop at and propagate outwards from saw cut line CL during the die singulation process. In one possible embodiment, the protective structures may be elongated via walls or bars 60 that are wall-shaped barriers which extend both vertically in the direction of vertical axis VA through a plurality of metal layers 21, 22 and horizontally in the direction of the longitudinal axis LA and/or transverse axis TA. For clarity, FIG. 6 shows via bars 60 as they would appear immediately below and contacting the lower surface 34 of uppermost test pad 33 (see FIGS. 7&8). Via bars 60 electrically contact and interconnect test pads 30, 33 in metal layers 21, 22 together. In contrast to separate conventional protective structures located external to the test pads and within the scribe bands/streets on the semiconductor wafer (see FIGS. 1 and 2), it should be noted that via bars 60 are embedded directly into the test pad interconnect structure 20 so that no additional surface area need be allocated for the protective crack-intercept barriers.

With continuing reference to FIGS. 6-8, via bars 60 have a total height H measured perpendicular to the upper/lower planar surfaces 32 of test pads 30, 33 and in the direction of vertical axis VA, a total length L measured in the direction of the longitudinal axis LA (parallel to the upper/lower planar surfaces 32 of the test pads) and in a direction perpendicular to vertical axis VA, and a total thickness T measured in the direction of the transverse axis TA (also parallel to the upper/lower planar surfaces 32 of the test pads) and in a direction perpendicular to vertical axis VA. Both the length L and height H of via bars 60 are preferably greater than thickness T, and more preferably greater than at least twice the thickness T of the via bar which is characteristic of a wall shape. Preferably, bar-shaped vias 60 have a sufficient thickness T as best shown in FIG. 5 that is selected to provide satisfactory electrical interconnection between the test pads 30, but to also contain and stop cracks propagating through insulating layers 40 from the cut line CL. It is well within the ambit of those skilled in the art to determine appropriate thicknesses T for vias 60. In some preferred embodiments, length L of via bars 60 is preferably larger than the height H of the via bars to form a protective wall structure.

With specific reference to FIGS. 7 and 8, each via bar 60 in one embodiment preferably extends vertically along vertical axis VA. Preferably, via bar 60 extends vertically for substantially the entire height of test pad interconnect structure 20 from the lower surface 34 of uppermost top test pad 33 down to the upper surface of lowermost bottom test pad 30. In other embodiments, via bar 60 may extend vertically into substrate 50 as shown for added protection. Via bars 60 may be progressively formed during the formation of each metal layer 22 (and in top metal layer 21) as the stacked metal layers are gradually built on top of each other starting with the lowermost metal layer. When the test pad interconnect structure is completed, as shown in FIGS. 7 and 8, the combination of via bars 60 and test pads 30, 33 form a monolithic vertical wall that preferably extends through all of the stacked metal layers for intercepting cracks and peeling that may develop at the cut line CL during die singulation.

Referring to FIG. 6, test pad interconnect structure 20 includes two opposing longitudinal sides 70 oriented parallel to cut line CL and longitudinal axis LA (extending along the longitudinal extent of the scribe bands), and two opposing transverse sides 72 oriented parallel to transverse axis TA (perpendicular to longitudinal axis LA and cut line CL). Sides 70 and 72 are connected by corners 71 formed therebetween, which may be square, angled or rounded in some embodiments. Sides 70 each define a longitudinal edge 73 and sides 72 each define a transverse edge 74.

Referring to FIGS. 6-8, one or more via bars 60 are preferably embedded along the perimeter of test pad interconnect structure 20 proximate to or at the longitudinal edges 73 and/or 74 in some embodiments. In one embodiment, at least one via bar 60 each is embedded proximate to longitudinal edges 73 at sides 70 as shown to intercept crack/peeling that may propagate transversely outwards from cut line CL when test pads 30 are saw cut (see FIG. 6). These via bars 60 form opposing and continuous longitudinal walls that preferably extend along each side 70 and edge 73 of interconnect structure 20 for the majority of the length LTP of test pad interconnect structure 20, and more preferably along substantially the entire length LTP of test pad interconnect structure 20 as shown. In some embodiments (not shown), via bars 60 may be located directly on and form part of edge 73, and further may extend all the way from opposite edges 74 formed on opposing transverse sides 72 of the test pad interconnect structure 20. As noted elsewhere herein, the via bars 60 preferably extend vertically through all of the metal layers 30 and 33 in test pad interconnect structure 20 so that the via bar walls can effectively intercept cracking/peeling to protect the adjacent IC dies regardless of whatever level these defects may originate at and/or propagate. In contrast to conventional cylindrical or other intermittent via structures used to form test pad interconnect structures as shown in FIGS. 3-5, via bars 60 according to the present invention preferably form a continuous protective barrier wall that extends along substantially the entire length LTP of test pad interconnect structure to eliminate any windows 16 formed through the insulating material 40 layers where cracks or peeling may propagate through and reach adjacent IC dies 81.

Figure 9:
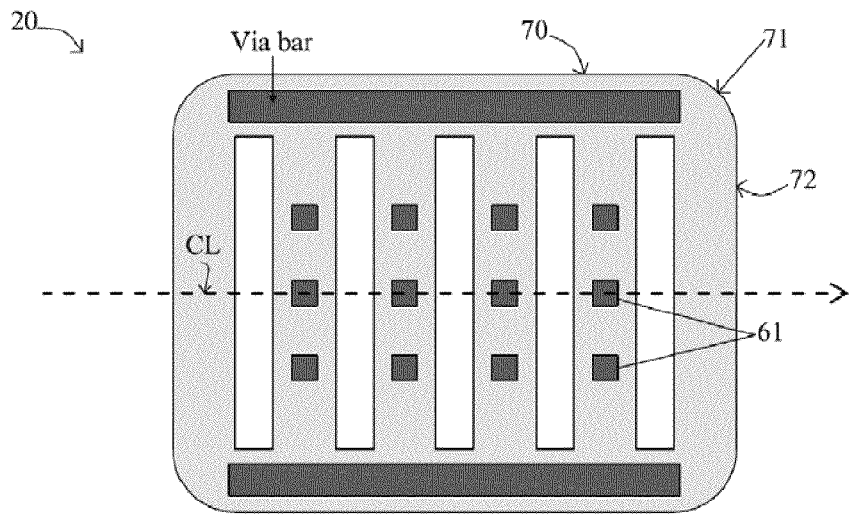
FIGS. 9-11 are plan views of alternative embodiments of test pad interconnect structures according to the present invention.
Figure 10:
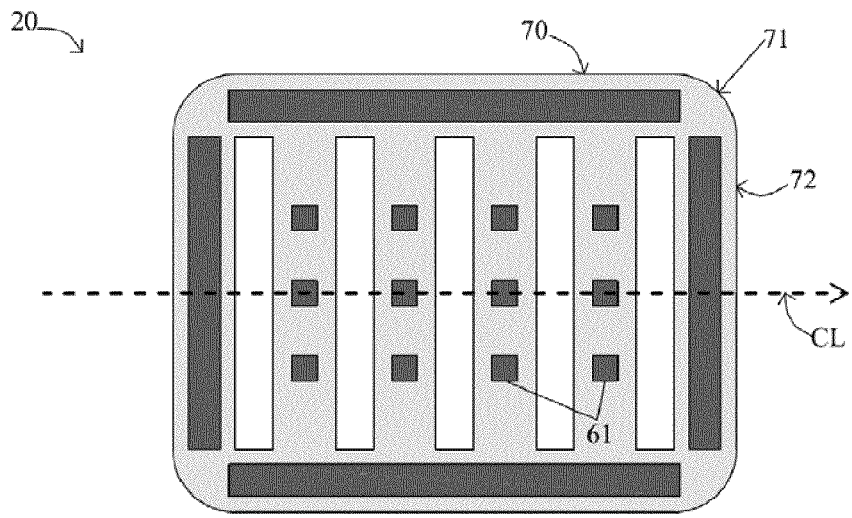
Figure 11:
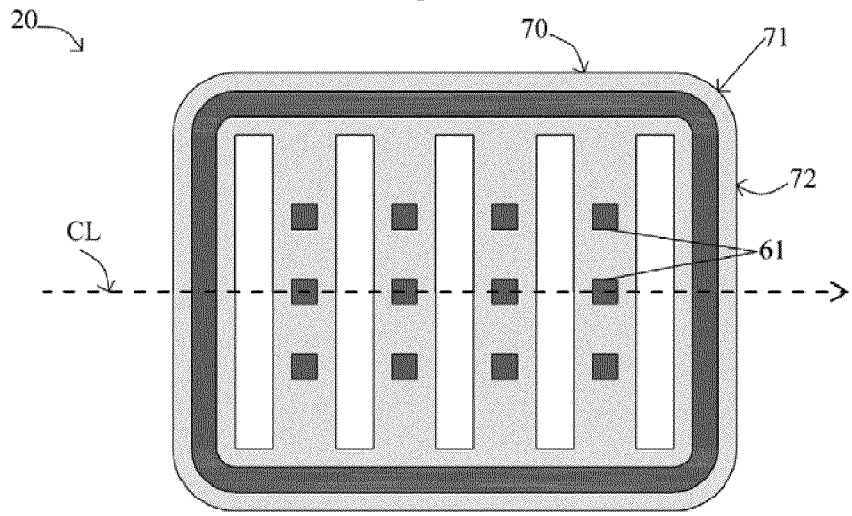

FIGS. 9-11 show alternative embodiments of via bars 60. In some embodiments as shown, test pad interconnect structure 20 may also include conventional cylindrical-shaped vias 61 to further electrically interconnect test pads 30, 33 together, in addition to via bars 60. In some embodiments as shown, the conventional vias 61 may be disposed inside the protective via bars 60 in test pad interconnect structure 20.

FIG. 10 shows an embodiment of a test pad interconnect structure 20 having a via bar 60 located along each side 70 and 72 at edges 73 and 74, respectively. This arrangement is capable of intercepting cracks and peeling propagating both along or parallel to cut line CL, as well as transverse to cut line CL. The via bars 60 may be separated by a gap at the corners 71 of the test pad interconnect structure 20 to form four discrete via bars which are oriented in two directions, as shown in FIG. 10.

FIG. 11 shows another possible embodiment of test pad interconnect structure 20 having a continuous via bar 60 in the form of a ring that extends around and adjacent to edges 73, 74 at sides 70, 72 respectively and along corners 71. This structure essentially forms an unbroken via ring around the entire periphery of interconnect structure 20 for confining cracks or peeling to within the test pad regardless of the direction in which these defects may propagate.

Test pads 30, 33 and via bars 60 may be made of any conventional electrically conductive metal or metal alloy commonly used in the fabrication of semiconductor devices, such as without limitation copper, aluminum, aluminum-copper, tungsten, and alloys thereof. In one embodiment, test pads 30, 33 and via bars 60 are made of copper or copper alloy. The test pads 30, 33 and via bars 60 may be made of the same metal or metal alloy, or different metal or metal alloys.

The test pad interconnect structure 20 according to the present invention, including via bars 60, PCM test pads 30 and 33, top test pad cap 31, metal layers 21 and 22, etc., may be formed by conventional MEMS and semiconductor fabrication processes well know to those skilled in the art concurrently with fabricating the IC dies on the wafer. These processes may therefore include without limitation material and film deposition, photolithography patterning, and material removal such as etching. In one embodiment, via bars 60 and test pads 30, 33 may be formed by successive conventional "damascene" process wherein a single interconnect feature (e.g. typically vias, trenches, contact pads, etc.) is formed and filled with a metallic conductor such as copper per stage. In other embodiments, a "dual damascene" process may be used wherein two interconnect features are formed and filled with a metallic conduct at once (e.g., typically features of a trench or contact pad overlying a via may both be filled with a metallic conductor deposition step). In yet other embodiments, a combination of damascene and dual damascene processes may be used. Accordingly, the present invention is not limited to use of either of the foregoing processes, or other conventional semiconductor fabrication processes that may be suitable for fabricating vias 60 and test pads 30, 33.

While the foregoing description and drawings represent preferred or exemplary embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. One skilled in the art will further appreciate that the invention may be used with many modifications of structure, arrangement, proportions, sizes, materials, and components and otherwise, used in the practice of the invention, which are particularly adapted to specific environments and operative requirements without departing from the principles of the present invention. In addition, numerous variations in the preferred or exemplary methods and processes described herein may be made without departing from the spirit of the invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A method for forming a test pad interconnect structure, the method comprising:

forming a plurality of vertically stacked metal layers, each metal layer including a metallic test pad electrically connected to a die and an inter-metal dielectric material, the test pads each having a first longitudinal side and a second opposite longitudinal side; and forming at least a first metallic via bar embedded into the interconnect structure and being configured and arranged to electrically interconnect the test pads in the plurality of metal layers, the via bar engaging each of the test pads near the first side of each test pad and forming a continuous metallic structure extending horizontally in a longitudinal direction along substantially an entire length of each first side of each test pad and vertically along at least all of the test pads in the stacked interconnect structure;

the test pad interconnect structure being disposed in a sacrificial scribe band formed between a pair of adjacent dies for separating the dies from the wafer;

wherein the via bar forms a monolithic wall-shaped protective barrier that has a vertical height that is at least coextensive with a vertical height of the plurality of metal layers and a horizontal length that extends for substantially the entire longitudinal side of each test pad.

2. The method of claim 1, wherein the via bar extends vertically through the dielectric material of each metal layer.

3. The method of claim 1, wherein the at least first metallic via bar is oriented parallel to a longitudinal axis defined by the test pads.

4. The method of claim 1, further comprising forming a second via bar embedded into the interconnect structure and being configured and arranged to electrically interconnect the test pads in the plurality of metal layers, the second via bar engaging each of the test pads near the second longitudinal side of each test pad and extending horizontally in a longitudinal direction along substantially an entire length of each second side of each test pad and vertically along at least all of the test pads in the stacked interconnect structure.

5. The method of claim 4, wherein the first and second via bars are disposed near opposite perimeters of the interconnect structure.

6. The method of claim 4, wherein the first and second via bars are disposed on opposite sides of a die singulation saw cut line defined by a longitudinal axis of the test pads.

7. The method of claim 1, wherein the via bar has a vertical height, a horizontal length, and horizontal thickness measured perpendicular to the length, the height and length being larger than the thickness.

8. The method of claim 1, wherein the plurality of metal layers includes at least three metal layers and the via bar extends vertically through all of the metal layers.

9. The method of claim 1, wherein the via bar is made of copper.

10. The method of claim 1, further comprising forming a metallic capping layer that at least partially covers a top metal test pad, the metallic capping layer comprising aluminum or aluminum alloy.

11. The method of claim 10, wherein the capping layer is surrounded by a first passivation layer.

12. The method of claim 4, further comprising:

forming a third via bar and a fourth via bar each being arranged at an angle transversely to the first and second via bars, the third and fourth via bars each being embedded into the interconnect structure and engaging each of the test pads, the third via bar extending horizontally in a transverse direction along substantially an entire length of a third transverse side of each test pad and vertically along at least all of the test pads in the stacked interconnect structure, the fourth via bar extending horizontally in a transverse direction along substantially an entire length of a fourth transverse side of each test pad and vertically along at least all of the test pads in the stacked interconnect structure.

13. The method of claim 12, wherein the third and fourth via bars are each connected respectively to the first and second via bars to form a ring-like continuous via bar structure.

14. The method of claim 12, wherein the third and fourth via bars are disposed across a die singulation saw cut line defined by a longitudinal axis of the test pads.

15. A method for forming a test pad interconnect structure, the method comprising:

providing a top metal layer including a top test pad having a planar surface and an inter-metal dielectric material disposed below the test pad, the test pad having a first pair of opposing longitudinal sides each having a first length and a second pair of opposing transverse sides each having a second length;

providing a second metal layer disposed below the top metal layer, the second metal layer having a second test pad having a planar surface and an inter-metal dielectric material disposed below the second test pad, the second test pad having a first pair of opposing longitudinal sides each having a first length and a second pair of opposing transverse sides each having a second length; and providing a first pair of opposing metallic via bars each extending vertically from the top metal test pad to the second metal test to form an electrical interconnection therebetween, the via bars each longitudinally engaging the top and second test pads along substantially the entire first length of one of the longitudinal sides of each test pad, the via bars each forming a continuous metallic structure extending horizontally in a longitudinal direction along substantially the entire first length of one of the longitudinal sides of each test pad and vertically along at least the top and second test pads in the stacked interconnect structure;

the test pad interconnect structure being disposed in a sacrificial scribe band formed between a pair of adjacent dies for separating the dies from the wafer;

wherein the via bars each form a monolithic wall-shaped protective barrier that has a vertical height that is at least coextensive with a vertical height of the top and second metal layers and a horizontal length that extends for substantially the entire respective longitudinal first length of each test pad.

16. The method of claim 15, wherein the first opposing pair of via bars are arranged in parallel relation to each other.

17. The method of claim 15, further comprising providing a second pair of opposing metallic via bars each extending vertically from the top metal test pad to the second metal test to form an electrical interconnection therebetween, the via bars each transversely engaging the top and second test pads along substantially the entire second length of one of the transverse sides of each test pad, the via bars each forming a continuous metallic structure extending horizontally in a transverse direction along substantially the entire second length of one of the transverse sides of each test pad and vertically in a vertical direction along at least the top and second test pads in the stacked interconnect structure.

18. A method for forming a test pad interconnect structure on a semiconductor wafer comprising:

providing a semiconductor substrate;

providing a plurality of integrated circuit dies formed on the substrate and arranged across a top planar surface of the wafer;

providing at least one longitudinally-extending scribe band formed between the dies and defining a longitudinally-extending saw cut line for separating the dies from the wafer;

providing at least one test pad interconnect structure disposed in the scribe band and having a portion that extends across the saw cut line, the interconnect structure comprising a plurality of vertically stacked metal layers, each metal layer including a metallic test pad and an inter-metal dielectric material, the test pads each having a first longitudinal side and a second opposite longitudinal side; and providing at least a first longitudinally-extending metallic via bar embedded into a perimeter portion of the interconnect structure and engaging each of the stacked test pads forming a continuous metallic structure extending horizontally along substantially the entire first longitudinal side of each of the test pads and vertically along at least all of the test pads in the stacked interconnect structure;

wherein the via bar forms a monolithic wall-shaped protective barrier that has a vertical height that is at least coextensive with a vertical height of the plurality of metal layers and a horizontal length that extends for substantially the entire longitudinal side of each test pad.

19. The method of claim 18, wherein the via bar is arranged parallel to the saw cut line and disposed between the saw cut line and at least one die lying adjacent to the scribe band.

20. The method wafer of claim 18, further comprising a second longitudinally-extending metallic via bar embedded into the perimeter portion of the interconnect structure and engaging each of the stacked test pads forming a continuous metallic structure extending horizontally along substantially the entire second longitudinal side of each of the test pads and vertically along at least all of the test pads in the stacked interconnect structure.

* * * * *